United States Patent [19]

Briguglio et al.

[11] Patent Number: 5,164,284
[45] Date of Patent: Nov. 17, 1992

[54] METHOD OF APPLICATION OF A CONFORMING MASK TO A PRINTED CIRCUIT BOARD

[75] Inventors: James J. Briguglio, Balboa; Leo Roos, Laguna Beach; Clancy P. Crooks, Cypress; Samuel W. Shoemaker, San Bernardino, all of Calif.

[73] Assignee: Morton International, Inc., Chicago, Ill.

[21] Appl. No.: 794,773

[22] Filed: Nov. 19, 1991

Related U.S. Application Data

[63] Continuation of Ser. No. 480,487, Feb. 14, 1990, abandoned, which is a continuation-in-part of Ser. No. 264,472, Oct. 28, 1988, Pat. No. 4,992,354, which is a continuation-in-part of Ser. No. 160,895, Feb. 26, 1988, Pat. No. 4,889,790.

[51] Int. Cl.$^5$ .................................................. G03C 11/12
[52] U.S. Cl. ........................................ 430/258; 430/319; 430/327; 430/328; 430/330
[58] Field of Search ............... 430/258, 319, 327, 328, 430/330

[56] References Cited

U.S. PATENT DOCUMENTS 4,127,436 11/1978 Friel ..................................... 430/256
4,530,896 7/1985 Christensen et al. ............... 430/155
4,889,790 12/1989 Roos et al. .......................... 430/319

Primary Examiner—Charles L. Bowers, Jr.
Assistant Examiner—Thorl Chea
Attorney, Agent, or Firm—Wayne E. Nacker; Gerald K. White

[57] ABSTRACT

A dry film for forming a solder mask includes a cover sheet, a photoimageable composition layer which is curable to form a solder mask and a top coat interposed between the cover sheet and the photoimageable composition layer which is selectively adherent to the photoimageable composition layer. The dry film is applied to a surface of a printed circuit board. With heat, vacuum and mechanical pressure, the photoimageable composition layer is laminated to the irregular surface of the printed circuit board, partially conforming the photoimageable composition layer to the contours thereof. Within about 60 seconds and with the photoimageable composition layer still heated, the cover sheet is peeled away, leaving the top coat as a protective covering over the photoimageable composition layer. Removal of the cover sheet allows the photoimageable composition layer to fully conform to the contours of the printed circuit board. Immediately thereafter, the circuit board is cooled to about ambient temperature or below. The photoimageable composition layer is exposed to patterned actinic radiation, developed, and cured to form a hard, permanent solder mask.

9 Claims, 3 Drawing Sheets

METHOD OF APPLICATION OF A CONFORMING MASK TO A PRINTED CIRCUIT BOARD

This is a continuation of co-pending application Ser. No. 07/480,487 filed on Feb. 14, 1990, abandoned which is a continuation-in-part of U.S. Pat. application Ser. No. 07/264,472, filed Oct. 28, 1988, U.S. Pat. No. 4,992,354, which in turn is a continuation-in-part of U.S. Pat. application Ser. No. 07/160,895 filed Feb. 26, 1988, U.S. Pat. No. 4,889,790 . The present invention is directed to a method of forming solder masks using dry films which conform to irregular surfaces.

BACKGROUND OF THE INVENTION

A solder mask is a hard, permanent layer of non-conductive material which covers the surface of a printed circuit board or the like, encapsulating the traces of the printed circuit itself. By solder mask is meant herein a hard, permanent layer which meets at least the minimal requirements of the abrasion resistance tests as defined in IPC-SM-840B, Table 12, Summary of Criteria for Qualification/Conformance (Institute for Interconnecting and Packaging Electronic Circuits). The solder mask is patterned to fully cover the circuitry, except for those portions intended to be exposed, e.g., for soldering to another component. Solder masks are typically formed from a layer of photoimageable composition which is applied to a surface of the printed circuit board. The photoimageable layer is exposed to actinic radiation which is patterned by means of a template or artwork. Subsequent to exposure, the photoimageable layer is developed in an organic solvent or an aqueous or semi-aqueous solution which washes away either exposed or unexposed portions of the layer (depending upon whether the photoimageable material is positive acting or negative acting). The portion of the layer which remains on the surface is then cured, e.g. with heat and/or UV light, to form a hard, permanent solder mask intended to protect the printed circuitry for the life of the board.

One prior art method of applying the layer of photoimage composition to the circuit board surface is to apply the material in liquid form, and then either allow it to dry or partially cure the material to form a semi-stable layer.

There are a number of advantages to applying a photoimageable layer to a circuit board as a dry film rather than as a liquid. In particular, dry films are free of organic solvent and therefore eliminate this hazard from the workplace and eliminate the need for apparatus to protect the immediate work environment and the more general environment from organic solvent emissions. Typically, a dry film comprises a cover sheet of support material which is somewhat flexible but which has sufficient rigidity to provide structure to a layer of photoimageable composition which overlies one surface of the cover sheet. Typically, the cover sheet is formed of polyester material, such as polyethylene terephthalate (PET), such as that sold as MELINEX ®.

To protect the photoimageable layer and to enable the dry film to be rolled, it is conventional that the exposed surface of the photoimageable layer be covered with a removable protective sheet e.g., a sheet of polyethylene. An example of such a dry film is sold as LAMINAR DM ® by Morton International, Inc.

The method of use of such a prior art dry film is generally as follows. The protective sheet is removed from the photoimageable composition layer immediately prior to application of the dry film to the surface of the printed circuit board. This may be accomplished, for example, using automated apparatus which peels away and rolls up the protective sheet as the dry film is unrolled from a reel. The dry film is applied to the surface of the circuit board with the photoimageable layer in direct contact with the board surface. Using heat, vacuum and mechanical pressure, the photoimageable layer is immediately laminated to the surface of the board. The cover sheet remains overlying the photoimageable layer, protecting the photoimageable layer from exposure to oxygen and from handling damage. The cover sheet also permits an artwork (or template) to be laid directly on top of the dry film for contact printing, if contact printing is to be used (as is usually preferred from the standpoint of obtaining optimal image resolution). The dry film is exposed to patterned actinic radiation through the PET cover sheet. At this time, the PET support sheet is removed, permitting access to the exposed photoimageable layer by developer. Depending upon the composition of the photoimageable layer, the photoimageable layer is developed with organic solvent alkaline aqueous developer, or alkaline semi-aqueous developer. By semi-aqueous developer is meant herein a developer which is about 90% or more by volume alkaline aqueous solution, balance an organic solvent, such as 2-butoxy ethanol and other glycol ethers. The photoimageable layer may either be positive acting, in which case the exposed portions are removed by developer, or negative acting, in which case the unexposed portions are removed by developer. Most photoimageable layers for preparing solder masks are negative acting. Most photoimageable composition layers require some cure subsequent to development to render the layer hard and permanent so as to serve as a solder mask. Depending upon the composition of the photoimageable layer, curing may be effected with heat and/or UV light.

Printed circuit boards almost invariably have uneven surfaces in which circuitry traces are elevated over the surface of a board of non-conducting material. Circuitry traces may be the residual portions of an etched metal layer or may be built up from the board surface. It is desirable that a solder mask, particularly one formed from a photoimageable composition, conform to the contours of a circuit board surface. A conforming solder mask which adequately covers both the board surface and upstanding traces minimizes the use of expensive photoimageable composition.

U.S. Pat. No. 4,127,436 issued to Friel describes a process which produces a conforming solder mask over a printed circuit board. This patent defines the invention as:

"a process of applying a photoresist-forming layer to a surface having a raised areas, comprising:
(1) positioning the surface of a solid, unexposed, photoresist-forming layer adjacent to a surface having raised areas, while the other surface of the layer has adhered thereto with low-to-moderate adherence a thin, flexible, polymeric film support,
(2) reducing the absolute gas pressure to less than one atmosphere in the region between the surface having raised areas and the surface of the layer, and
(3) applying pressure to the entire surface of the film support at once over the area of the layer adjacent to the surface having raised areas, whereby the photoresist-forming layer is forced into intimate contact with the surface having raised areas.

The invention also provides a process for forming a photoresist on a surface having raised areas comprising, in addition to the steps above, in either order of steps (4) and (5):

(4) exposing the layer, imagewise, to actinic radiation,
(5) stripping the film support from the resulting image-bearing layer, and
(6) removing areas of the layer imagewise to form a resist image on the surface having raised areas."

The Friel process provides for exposure (step (4)) either before or after the film support is stripped (step (5)) from the photoimageable layer. Exposure through the film support has the disadvantage of reducing resolution and furthermore limits the conformability of the photoimageable layer to the uneven substrate surface. Although the Friel process contemplates stripping of the film support prior to exposure, it is inherent from the total description in the Friel patent that such stripping be immediately prior to exposure. Once the support film is stripped in the Friel process, there is no protection of the tacky photoimageable layer from contact with surfaces and no protection against oxygen inhibition. As the process is described in the Friel process, the board surface to which the dry film is applied is contacted with other surfaces; thus it is inherent that the support film is not stripped from the photoimageable layer immediately after the dry film is applied to the printed circuit board, even if steps (4) and (5) are reversed. Therefore, the support film still acts as a limitation to the conformability of the attached photoimageable layer. If steps (4) and (5) are reversed, the film support no longer acts as a barrier to resolution; however, little is gained in this respect because the exposed, tacky photoimageable layer cannot be contact printed. Any distance between the off-contact artwork and the photoimageable layer is a limitation on resolution.

The above identified U.S. Pat. applications, of which this application is a continuation-in-part, describe processes of applying a solder mask-forming photoimageable composition layer to a printed circuit board using a dry film in which an intermediate layer is interposed between the "support film" or "cover sheet" and the photoimageable layer. The intermediate layer is selectively more adherent to the photoimageable composition layer than to the cover sheet, allowing the cover sheet to be removed after the photoimageable layer is applied to a printed circuit board with the intermediate layer remaining on the photoimageable composition layer as a "top coat". The top coat is of non-tacky material and can be placed in contact with other surfaces, such as artwork for contact printing. The top coat also serves as an oxygen barrier, allowing the photoimageable composition layer to remain unexposed on the printed circuit board, after cover sheet removal, for some length of time. The use of dry film having the "intermediate layer" or "top coat" make possible the processes described in these applications. In each case there is provided a conforming step, e.g., conforming vacuum lamination, after removal of the cover sheet. Because the cover sheet is removed prior to the conforming step, better conformance, particularly when applying thin photoimageable composition layers onto boards with closely spaced traces, is achieved relative to the degree of conformance achieved in the Friel process in which conformance is hindered by the support film that remains on the photoresist layer during the conforming step. Better resolution is also achievable because the top coat may be directly contacted with artwork for contact printing (unlike the off-contact process required of the Friel process when support film removal precedes exposure), and because the top coat is much thinner than a cover sheet or support film and is therefore much less a deterrent to good resolution than a support film (as in the Friel process where exposure precedes support film removal).

The results of the processes described in the above-identified U.S. Pat. application have been most encouraging. However, difficulties have been encountered in attempting to adapt these processes to an in-line system. This is particularly true with respect to the utilization of existing vacuum laminating apparatus in an in-line process. Vacuum laminators represent a considerable capital expense, and owners of such laminators are often reluctant to replace existing laminators in order to experiment with new dry films and new processes.

It is a general object of the present invention to provide a method of forming a conformed solder mask on a printed circuit board which achieves all of the advantages obtained in the process described in the above-identified U.S. Pat. application but which in many instances is more adaptable for in-line systems.

SUMMARY OF THE INVENTION

For utilization is the process in accordance with the invention, there is provided a dry film which includes a photoimageable composition layer that forms a solder mask on a printed circuit board or the like. The dry film utilized in the method includes a cover sheet formed of flexible, but generally non-conforming material, giving the dry film shape while allowing it to be rolled into a reel. On one surface of the cover sheet is a thin layer of material, referred to herein as a top coat, which is preferably soluble in the developer for the photoimageable composition. The photoimageable composition forms a layer over the other surface of the top coat. A removable sheet (which is optional, but highly preferred) protects the photoimageable composition layer. The material which is used to form the top coat is selectively adherent to the photoimageable composition layer relative to its adherence to the cover sheet, whereby the cover sheet may be removed from the top coat and thereby leave the top coat as a protective covering for the photoimageable composition layer.

To form a solder mask in accordance with the process of the present invention, the protective, removable sheet of polyethylene is first peeled away, and the exposed surface of the photoimageable composition layer is applied to the surface of the printed circuit board. Using heat, vacuum and mechanical pressure, the dry film is laminated to the surface of the printed circuit board, partially conforming the photoimageable layer thereto. Following vacuum lamination, within about 60 seconds and before substantial cooling of the printed circuit board and dry film has occurred, the cover sheet of the dry film is removed, whereupon the photoimageable composition layer and overlying top coat fully conform to the contours of the printed circuit board and substantially encapsulate the traces. The board is then cooled to room temperature or preferably to below room temperature. The photoimageable composition layer is then exposed to patterned actinic radiation through the top coat. A developer is used to remove either exposed or non-exposed portions of the photoimageable composition layer, leaving the remaining portion of the layer laminated to the circuit board. Subsequently, the portions of the photoimageable composition layer remaining on the circuit board are cured, e.g., with heat and/or UV light.

In accordance with another aspect of the invention, there is provided a finishing unit for printed circuit boards to which a photoimageable composition layer has been hot laminated. The finishing unit comprises cooling region means for cooling the printed circuit board to about ambient temperature or below, hot roll means for applying heat and pressure to the surface(s) of the printed circuit board to which the photoimageable composition layer(s) has been laminated, and conveyer means for conveying the printed circuit board through the cooling means and subsequently through the hot roll means. The finishing unit preferably includes a refrigeration means for supplying air at below ambient temperature to the cooling region means. The finishing unit also preferably includes downstream conveyor means for transporting the printed circuit board from the hot roll means to downstream apparatus.

DETAILED DESCRIPTION OF CERTAIN PREFERRED EMBODIMENTS

Figure 1:
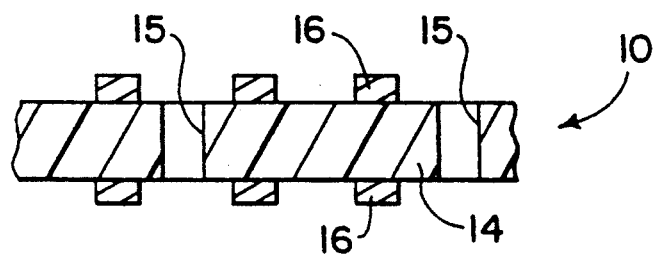
FIG. 1 is a cross-sectional view of a printed circuit board.

With reference to FIG. 1, a circuit board 10 comprises a board 14 of non-conductive material, e.g., formed of epoxy, and the conductive traces 16 which comprise the printed circuit. Typically, as shown in FIG. 1, the board 14 has traces on both sides, and may include via holes 15, as a means for connecting the circuitry on the two sides of the board.

Figure 2:
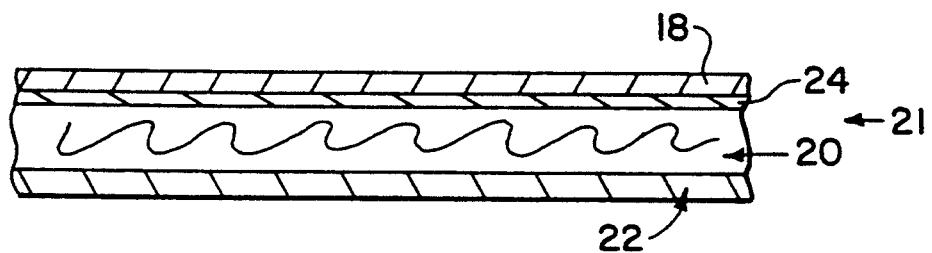
FIG. 2 is a cross-sectional view of a dry film in accordance with the invention used for forming a solder mask.

Illustrated in FIG. 2 is a dry film 21 used in the method of the present invention. This dry film 21 comprises a cover sheet 18, a layer 20 of photoimageable composition which is processable to form a hard, permanent solder mask and an optional, but preferred, protective sheet 22. In addition, the dry film 21 includes a top coat 24 intermediate to the cover sheet 18 and the photoimageable composition layer 20. The material for the top coat 24 has selective adherence to the photoimageable composition layer 20 relative to its adherence to the cover sheet 18, whereby the cover sheet may be peeled away from the remaining layers 20, 24 of the circuit board-adhered dry film, leaving the top coat 24 protecting the photoimageable composition layer 20. The top coat 24 is formed of material which also is selected for oxygen-impermeability, whereby it protects the underlying layer of photoimageable composition 20 from oxygen inhibition during free radical photopolymerization in the exposure step. Preferably, the top coat 24 is also selected to be soluble in the developer for the photoimageable composition, whereby the top coat is removed during the development process. It is possible, however, that the top coat 24 not be soluble in the developer, in which case the top coat must be removed in a predevelopment or postdevelopment step. The top coat material is further selected for transparency, strength and flexibility.

In accordance with the method of the present invention. The circuit board 10 and dry film 21 are laminated in a vacuum laminator 100 (FIG. 3) at elevated temperature using vacuum and mechanical pressure to strongly adhere and conform the photoimageable layer to the surface of the photoimageable layer. (The application step and lamination step may be contemporaneous.) Immediately after vacuum lamination, i.e., within about 60 seconds and more preferably within about 30 seconds after vacuum lamination, and before substantial cooling of the heated circuit board 10 and dry film 21, the cover sheet 18 is stripped from the photoimageable composition layer 20 and overlying top coat 24. It is found that if cover sheet 18 removal is immediate after vacuum lamination and with the dry film and circuit board 10 still at somewhat elevated temperature, as good conformance is achieved as when the cover sheet is removed prior to lamination. The conformance to the contours of the printed circuit board 10, particularly a board 10 having closely spaced traces 16, are demonstrably superior to that achieved with the above-discussed Friel process in which the support film is removed some substantial time after vacuum lamination, during which time the photoimageable layer, if heated, would presumably have cooled to ambient temperature. It is believed that in the process of the present invention, during vacuum lamination with the cover sheet still on the top coat 24 and photoimageable composition layer 20, a degree of conformance of the photoimageable layer to the contours of the printed circuit board 10 occurs, but that there remain vacuum pockets between the uneven surface of the printed circuit board 10 and the photoimageable composition layer 20. Upon removal of the cover sheet 18 immediately subsequent to vacuum lamination, it is believed that the photoimageable layer is depressed into these vacuum pockets, due to the differential in pressure fully conforming the photoimageable composition layer 20 to the contours of the printed circuit board 10.

Figure 3:
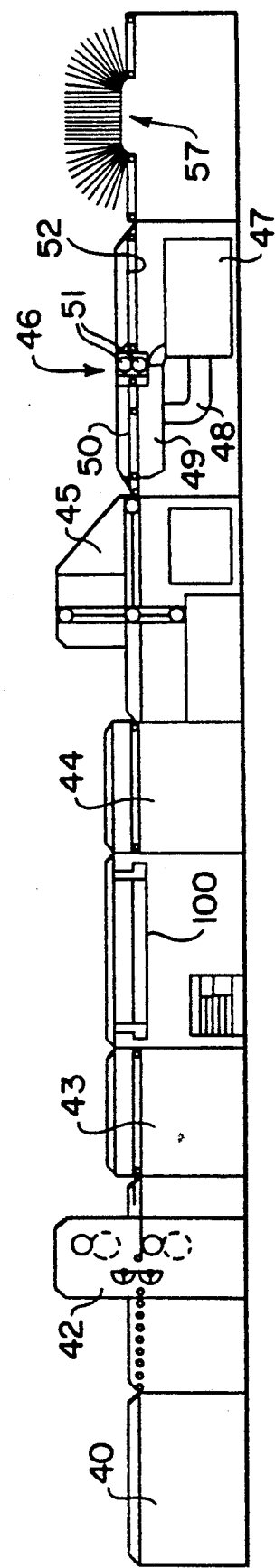
FIG. 3 is a diagrammatic representation of apparatus for in-line application of a solder mask-forming dry film in accordance with the present invention.

FIG. 3 represents diagrammatically one in-line system which utilizes the process of the present invention. This apparatus is useful for coating both one-sided and two-sided boards, two-sided coating being most common. The printed circuit board is supplied from a loader 40 and from there is conveyed to a cut sheet film applicator 42 which lightly applies dry film 21 to the surfaces of the board 10 and also cuts the dry film along the edges of the board. From the applicator 42, the covered board is carried by a staging conveyer 43 to the vacuum laminator 100, whereat heat, vacuum and mechanical pressure are used to partially conform the photoimageable composition layers 20 to the contours of the surfaces of the printed circuit board.

The laminator 100 heats the dry films 21 and printed circuit board 10 to a temperature whereat the photoimageable composition layer is substantially more conformable than it is at room temperature. Laminating temperatures range from about 40° C. to about 100° C., a rnage of between about 55° C. to about 80° C. being typical. Laminating vacuums of at least about 0.3 millibar are used, and preferably a vacuum of at least about 1 millibar is used. In conventional vacuum lamination, in addition to heat and vacuum, mechanical pressure is brought to bear against the dry film. In what is known as a "slap-down, a blanket and/or platen is used to press the dry films 10 against the printed circuit board 10. Commercial examples of laminators using mechanical pressure in addition to heat and vacuum are models 724 and 730 sold by Morton International, Inc.

Figure 4A:
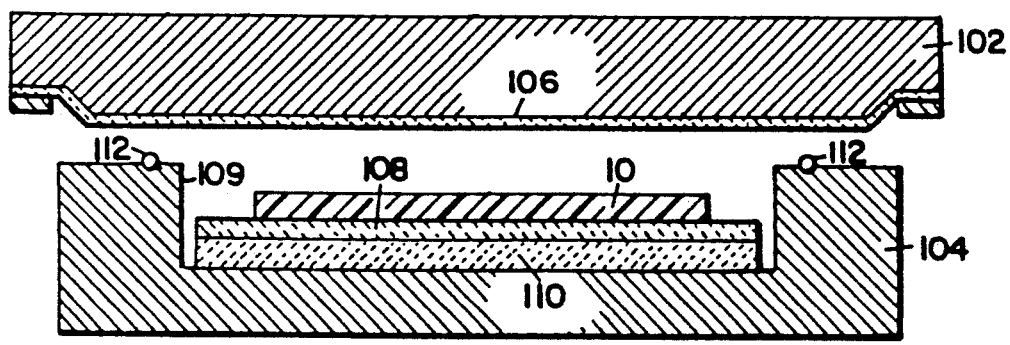
FIG. 4A, 4B and 4C illustrate diagrammatically a vacuum applicator and a platen operation sequence thereof.
Figure 4B:
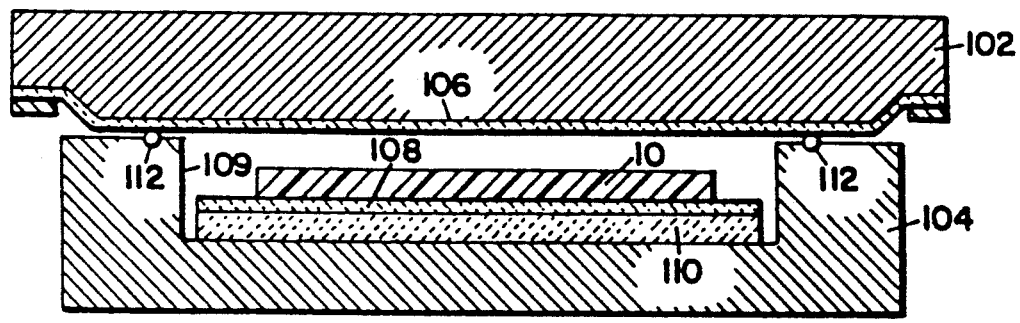
Figure 4C:
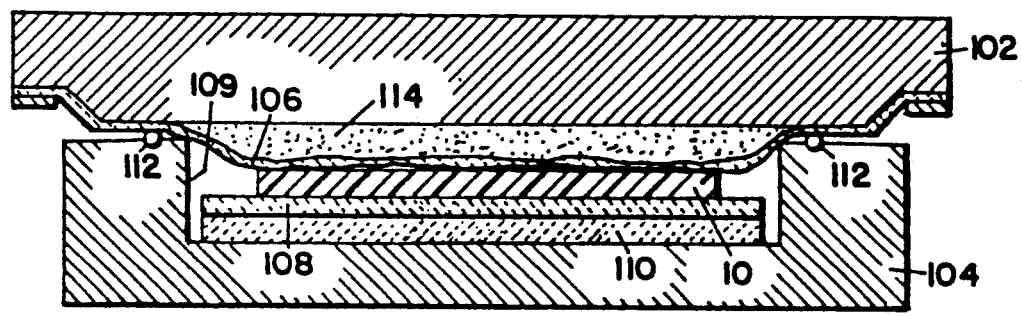

Such vacuum laminating apparatus 100 is briefly described with respect to FIG. 4A, 4B and 4C. The apparatus includes an upper stationary plate 102 and a lower movable platen 104. Associated with the upper platen 102 is an upper resilient blanket 106; associated with the lower platen 104 is a lower resilient blanket 108. The lower platen 104 has a well 109 for carrying a dry film-covered circuit board 10. Sealing means in the form of an O-ring 112 are provided on the lower platen 104 for hermetically sealing the well 109 when the lower platen is brought into contact with the upper platen 102 and its associated blanket 106. Also shown in FIGS. 4A-4C is a shim 110. The shim is also formed of resilient material and is used to accommodate boards of different thickness. Several shims may be used, including shims interposed between the upper plate 102 and upper blanket 106. Typically the lower platen 104 is reciprocal both horizontally and vertically. With the lower platen 104 out of horizontal alignment with the upper platen 102, the dry film-covered circuit board 10 is placed in the well 109 on top of the lower blanket 108. Then the lower platen 104 is moved vertically into alignment with the upper platen 102, the condition shown in FIG. 4A. Next, the lower platen is moved upward until contact is effected between the O-ring 112 and the upper platen 102 and its associated blanket 106 (FIG. 4B). Not shown are means to apply a vacuum in he region of the well 109 which contains the circuit board 10. Also, not shown are means to provide a vacuum between the upper platen 102 and the upper blanket 106. After the well region 109 has been sealed, vacuum is applied both to the well region 109 and between the upper platen 102 and upper blanket 106. During this time, the circuit board 10 merely rests on the lower blanket 108. The vacuum in the well region 109 serves to remove air from between the dry film layers 20, 24 and the surfaces of the circuit board and to draw the layers of the dry film to the surfaces of the circuit board. For a short period at the end of the cycle, the vacuum is released from between the upper platen 102 and the upper blanket 106. The vacuum in the well region 109, causes the upper resilient blanket 106 to "slap down" against the board 10, pressing the board and dry film layers between the upper and lower blankets 106, 108 as seen in FIG. 4C. Finally, the vacuum is released from the well region 109 and the lower platen 104 is removed vertically and then horizontally from the upper platen 102 to allow removal of the laminated board.

Returning now to FIG. 3, an important aspect of the present invention requires that the cover sheet 18 be removed, just after vacuum lamination while the photoimageable composition layer 20 and top coat 24, which remain on the board surface, are still at elevated temperature and substantially more conformable than these layers are at ambient temperature. Generally, the cover sheet 18 is to be removed within about 60 seconds and more preferably within about 30 seconds after leaving the vacuum laminator. If exposed to ambient temperature, i.e., between about 20° C. and about 25° C. after leaving the vacuum laminator, the temperature of the layers 20 and 24 on the circuit board 10 do not generally drop more than about 10° C. during this time. Although applicants are not held to any particular theory, it is believed that while the cover sheet 18 is still on the layers 20 and 24 of the dry film, conformance of these layers 20 and 24 is not complete; but rather, vacuum pockets exist between the photoimageable composition layer 24 at the uneven surface of the circuit board 10. Providing that the cover sheet 18 is removed while the underlying layers 20 and 24 are still at elevated temperatures, the photoimageable layer 20 is depressed into the vacuum pockets and fully conforms to and adheres to the circuit board. The intermediate layer 24 retains its integrity during this collapse and provides a continuous barrier, protecting the photoimageable composition layer 20 from the effects of mechanical contact and from oxygen inhibition. In the apparatus of FIG. 3, a staging conveyer 44 carries the laminated board from the vacuum laminator 100 downstream to a cover sheet remover 45.

It is further found, in accordance with the present invention, that best results are achieved if, after cover sheet removal in apparatus 45, the circuit board having the photoimageable composition layer 20 and top coat 24 thereon, is rapidly cooled to ambient temperature or below. This is achieved in a finishing unit 46 which blows air at either ambient temperature, or preferably cooled air, across the surfaces of the coated circuit board. It is preferred that the photoimageable composition layer be cooled to the appropriate temperature within about 60 sec. of cover sheet removal. The rapid cooling of the photoimageable composition layer 20 subsequent to cover sheet removal stops the flow of the heated composition, thereby minimizing thinning of the photoimageable composition layer. It is found that in the absence of immediate cooling, there tends to be a failure of tenting over via holes 15.

The finishing unit 46 provides either ambient air at a sufficient rate to effect rapid cooling to the appropriate temperature or preferably refrigerated air. The illustrated finishing unit includes a refrigeration unit 47 with blower means (not shown), and air is directed through a conduit 48 to as cooling region 49 through which the circuit board is conveyed by an upstream conveyer 50. The cooling region 49 is designed to distribute the cooling air over the surfaces of the board. This may be accomplished, for example, by a manifold of tubing having air-passage orifices that direct air toward the printed circuit board or, alternately, by means of baffles or plenums.

The finishing unit 46 of the present invention also includes a pair of heated rolls 51 providing a nip through which the printed circuit board passes. It is found that a hot roll section improves conformance of the photoimageable composition layer 20 over via holes 15. The hot rolls 51 have a resilient surface suitable for applying pressure over the uneven contours of the coated printed circuit board. Generally, the hot rolls 51 are heated to temperature of between about 55° and about 75° C. The finishing unit also has a downstream conveyor 52 for transporting the finished circuit board from the finishing unit, for example, to a racker 57.

Subsequent to lamination and cover sheet removal, the solder mask is formed by processing the layer of photoimageable composition in a conventional manner. Artwork is laid over the remaining layers 20, 24 of the dry film; the top coat 24 prevents the artwork from sticking.

The photoimageable composition layer 20 is exposed to patterned actinic radiation through the protective top coat 24. The top coat 24 is thin, typically in the range of about 2–3μ (as opposed to a cover sheet, typically in the range of about 25μ, through which photoimageable composition layers 20 of conventional solder mask-forming dry films 12 must be exposed) contributes to improved resolution. Further contributing to enhanced resolution is the relative thinness of the photoimageable composition layer 20 itself. As noted above, with a conventional solder mask-forming dry film 12, which is intended to be exposed through the cover sheet 18, the photoimageable composition layer typically must cover traces 16 with elevation of 50μ or more, and the photoimageable composition layers are typically about 100μ thick. Because the photoimageable composition layer 20 of the dry film of the present invention is conformable to the surface contours of the circuit board 10, a thickness of 50μ or less is sufficient to cover traces elevated 50μ and even up to about 75μ above the flat surface of the board 14. Of course, a further advantage is substantially reduced levels of expensive photoimageable composition used to form the layer 20.

An additional advantage of a thin, conforming photoimageable layer is that the solder mask which forms in the regions between the traces 16 is generally at or below the level of the traces. With conventional solder masks, slight elevated regions exist between the traces. Such elevated regions may result in the component, which is being soldered, sitting high on the solder mask and preventing pins of the component from being adequately soldered to exposed trace portions. Alternatively, the elevated regions may, during reflow, result in some of the pins of a soldered component breaking contact, causing the component to stand up at one end, an effect known as "tombstoning". Inadequate soldered contact and "tombstoning" are avoided when "valleys" instead of elevated regions exist between exposed portions of the traces.

After exposure to actinic radiation, the layers 20 and 24 are developed, the developer removing the top coat 24 and appropriate portions of the photoimaged layer 20.

The dry film solder mask used in the method of this invention has the same ability to "tent" via holes as conventional primary imaging or solder masks films. This is a very important part of the process and cannot be duplicated with simple liquid processes.

Generally, an additional cure follows development in order to harden the solder mask. Typically, heat and/or UV light are used to effect this cure.

The present invention is not primarily directed to materials from which the various sheets and layers are formed; and reference is again made to U.S. Pat. No. 4,530,896 for a description of suitable materials. The cover sheet 18 is generally formed of a polyester, such as PET and is generally at least about 25μ, or thicker, and up to about 75μ thick.

PET, if used for the support sheet, is preferably surface-treated to provide adequate hydrophilicity or wetting angle so that it does not adhere strongly to the top coat. Preferably, the wetting or contact angle of the cover sheet material is at least about 60° and is preferably 75° or less. One suitable PET cover sheet is sold under the trade designation Melinex-393 by ICI. This is a PET that is surface-treated on one side to enhance its hydrophilicity, i.e., increase its wetting angle.

Other suitable cover sheet materials include, but are not limited to polyamides, polyolefins, vinyl polymers, and cellulose esters.

Any photoimageable composition suitable for forming solder masks and is sufficiently flexible to be rolled as a layer of reeled dry film is suitable for practice of the invention.

The protective sheet 22 is selected to be removable from the photoimageable composition layer 20, and is typically a polyethylene sheet, between about 15μ and about 35μ thick.

The top coat 24 is formed of a material which provides the requisite selective adherence. The top coat is typically from about 1μ to about 12μ thick, typically between about 2μ and about 5μ. When using a PET cover sheet and a photoimageable material which is developable in aqueous or alkaline aqueous developer, a suitable top coat consists essentially of (a) between about 10 weight percent and 100 weight percent of either polyvinyl alcohol hydrolyzed to at least about 75% or a copolymer formed by the copolymerization of between about 95 and about 99 molar percent of polyvinyl acetate and between and 1 and about 5 molar percent of alkyl ester of acrylic acid and being hydrolyzed to at least about 75 percent; (b) up to about 90 weight percent of hydroxyethyl cellulose; and (c) up to about 10 weight percent of plasticizer. Preferably, hydroxyethyl cellulose is used at a level of at least 25 wt. percent and more preferably at a level of at least about 50 wt. percent.

The above described copolymers are sold under the trade designation VINOL-118 M by Air Products, and 4 weight percent solutions of these copolymers and have viscosities ranging from about 5 to about 65 centipoise at 20° C. PVC homopolymers of similar viscosity are useful as well. Commercially suitable PVA's are also sold by Air Products.

A plasticizer, if used, tends to lower the tack temperature of the top coat composition, and tack temperature below about 100° C. have been achieved using such plasticizers. A top coat composition having a lower tack temperature is easier to adhere to the photoimageable layer. Preferred plasticizers are low molecular weight compounds, e.g., below about 200, having two or more hydroxyl groups, such as glycerine, ethylene glycol and propylene glycol. While plasticizers desirably lower the tack temperature, they also increase oxygen permeability of the top coat; accordingly amounts of plasticizers in excess of about 10% by weight are desirably avoided.

Other suitable materials for top coat use include, but are not limited to, the group consisting of polyvinyl ether-maleic anhydride copolymers, water-soluble cellulose ethers, water-soluble salts of carboxyalkylcellulose, water-soluble salts of carboxyalkyl starch, polyvinyl alcohol, polyvinyl pyrrolidone, various polyacrylamides, various water-soluble polyamides, water-soluble salts of polyacrylic acid, gelatin, ethylene oxide polymers, various starches and the like.

The method of forming the dry film is according to known procedures. The top coat and photoimageable composition layers are successively layered on the cover sheet by methods, such as roller coating or by spraying solutions or dispersions of the materials.

While the invention has been described in terms of certain preferred embodiments, modifications which would be obvious to one with ordinary skill in the art may be made without departing from the scope of the invention.

Various features of the present invention are set forth in the following claims.

What is claimed is:

1. A method of forming a solder mask on the surface of a printed circuit board, said surface having raised areas, the method comprising:
   (A) providing a dry film comprising
      (1) a cover sheet,
      (2) a top coat on said cover sheet,
      (3) a layer of photoimageable composition on said top coat, which photoimageable composition is curable after exposure and development to provide a hard, permanent solder mask overlying the printer circuit board; said top coat being selectively adherent to said photoimageable composition relative to its adherence to said cover sheet;
   (B) applying said photoimageable composition layer to the surfaced of said printed circuit board;
   (C) laminating said photoimageable composition layer to the surface of said printed circuit board using heat, vacuum and mechanical pressure;
   (D) within about 60 seconds of completion of step (C), with said photoimageable composition layer still at elevated temperature, removing said cover sheet from said top coat, leaving said photoimageable composition layer tacked to the surface of said circuit board with said top coat covering and protecting the same;
   (E) exposing said photoimageable composition layer to patterned actinic radiation;
   (F) developing said photoimageable composition to remove either exposed or unexposed portions from said printed circuit board, leaving either unexposed or exposed portions remaining on said printed circuit board; and
   (G) curing said remaining portions of said photoimageable composition layer to form a hard, permanent solder mask protecting said printed circuit board.

2. A method according to claim 1 wherein said lamination (C) is conducted at a temperature of between about 40° C. and about 100° C.

3. A method according to claim 1 wherein said lamination (C) is conducted at a temperature range of between about 55° C. and about 80° C.

4. A method according to claim 1 wherein immediately subsequent to step (D) and prior to step (E), said circuit board and said overlying photoimageable composition layer and said top coat are rapidly cooled to ambient temperature or below.

5. A method according to claim 4 wherein said photoimageable composition layer is cooled to about ambient temperatures or below within about 60 seconds after cover sheet removal.

6. A method according to claim 4 wherein immediately subsequent to said rapid cooling, said photoimageable composition layer is pressed with heated roll means.

7. A method according to claim 6 wherein said heated roll means are heated to between about 55° and about 75° C.

8. A method according to claim 1 wherein in step (D) said cover sheet is removed from said top coat within about 30 seconds subsequent to vacuum lamination.

9. A method according to claim 1 wherein in step (D) said cover sheet is removed from said top coat before said photoimageable composition layer has cooled more than about 10° C.

* * * * *